(12) United States Patent
Kang et al.

(10) Patent No.: US 7,352,050 B2
(45) Date of Patent: Apr. 1, 2008

(54) FUSE REGION OF A SEMICONDUCTOR REGION

(75) Inventors: Hyuck-Jin Kang, Seoul (KR); Chang-Suk Hyun, Yongin-si (KR); Il-Young Moon, Seongnam-si (KR); Kang-Yoon Lee, Seongnam-si (KR); Kwang-bo Sim, Seoul (KR); Sang-Kil Jeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 226 days.

(21) Appl. No.: 11/079,302

(22) Filed: Mar. 15, 2005

(65) Prior Publication Data

US 2005/0212081 A1 Sep. 29, 2005

(30) Foreign Application Priority Data

Mar. 25, 2004 (KR) .................... 10-2004-0020520

(51) Int. Cl.
*H01L 29/06* (2006.01)
(52) U.S. Cl. .............. 257/529; 257/665; 257/538; 257/209; 257/E23.149; 438/132; 438/215; 438/281; 438/333; 438/467
(58) Field of Classification Search ............ 257/529
See application file for complete search history.

(56) References Cited

U.S. PATENT DOCUMENTS

2001/0042897 A1* 11/2001 Yeh et al. ............... 257/529
2002/0028539 A1* 3/2002 Ema ........................ 438/132
2003/0011042 A1* 1/2003 Kagiwata ................. 257/529
2003/0038339 A1 2/2003 Mori
2003/0141568 A1* 7/2003 Sato et al. ............... 257/529
2004/0185678 A1* 9/2004 Lee et al. ............... 438/780
2005/0189612 A1* 9/2005 Hung et al. .............. 257/529

FOREIGN PATENT DOCUMENTS

| JP | 11-087521 | 3/1999 |
| JP | 2003-037166 | 2/2003 |
| KR | 1020000061306 | 10/2000 |
| KR | 1020010053839 | 7/2001 |

\* cited by examiner

*Primary Examiner*—Jerome Jackson
*Assistant Examiner*—Paul Budd
(74) *Attorney, Agent, or Firm*—Lee & Morse, P.C.

(57) ABSTRACT

In a fuse region of a semiconductor device, and a method of fabricating the same, the fuse region includes an interlayer insulating layer on a semiconductor substrate, a plurality of fuses on the interlayer insulating layer disposed in parallel with each other, a blocking layer on the interlayer insulating layer between each of the plurality of fuses and in parallel with the plurality of fuses, and a plurality of fuse grooves recessed into the interlayer insulating layer between each of the plurality of fuses and the blocking layer.

9 Claims, 5 Drawing Sheets

FUSE REGION OF A SEMICONDUCTOR REGION

BACKGROUND OF THE INVENTION

1. Field of the Invention

The present invention relates to a semiconductor device and a method of fabricating the same. More particularly, the present invention relates to a fuse region of a semiconductor device and a method of fabricating the same.

2. Description of the Related Art

In general, semiconductor devices, i.e., chips, formed in a semiconductor substrate are electrically tested before an assembly process. Based on the test results, the semiconductor devices are classified as "bad" chips and "good" chips. When a malfunction of a bad chip occurs due to at least one failed cell, the failed cell is substituted with a redundant cell using a repair process. The repair process includes a step of laser beam illumination for blowing certain fuses so that the redundant cell may obtain an address of the failed cell in both read and write modes. When forming bit lines and word lines in a conventional semiconductor device, the fuses are formed on a same layer as the bit lines or word lines. However, as semiconductor devices become more highly integrated, each of the semiconductor devices has an increased height, which leads to a difficulty in forming a fuse window and blowing a fuse. Therefore, in order to facilitate these operations, a method of forming a metal fuse on a same layer as an upper metal wiring of the semiconductor device has been used.

FIG. 1 illustrates a cross-sectional view of a fuse region of a conventional semiconductor device.

Referring to FIG. 1, an interlayer insulating layer 100 is disposed on a semiconductor device (not shown). A fuse window 102 for blowing a fuse 104 is formed in the interlayer insulating layer 100. Fuses 104 are buried in the interlayer insulating layer 100 below the fuse window 102. During a repair process, any one of the fuses 104 may be blown by a laser beam penetrating the fuse window 102. However, when the fuses 104 are buried in the interlayer insulating layer 100, as described above, the repair process may not be reliable. More specifically, when any one of the fuses 104 is blown, the corresponding fuse may not be completely blown and a portion of the fuse 104 may remain in the interlayer insulating layer 100 as a residue. In particular, the residue is more likely to remain at a lower end of a sidewall B1 of the fuse 104. Further, when energy of the laser beam is increased to prevent such residues from remaining and to fully blow the fuse, fuses adjacent to the fuse to be blown may be damaged. The possibility that adjacent fuses may be damaged increases as a gap between the fuses 104 is reduced due to the increasing integration of semiconductor devices.

FIG. 2 illustrates a cross-sectional view of a fuse region of another conventional semiconductor device.

Referring to FIG. 2, a fuse window 202, in which fuses 204 are disposed, is disposed for blowing a fuse in an interlayer insulating layer 200. The fuses 204 are disposed such that some portions thereof may be buried in the interlayer insulating layer 200 below the fuse window 202. An insulating layer 206 conformably covers the fuses 204 and the interlayer insulating layer 200, and has a convex structure at each upper portion of the fuses 204. To blow a fuse in this conventional structure, a laser beam is focused on the fuse to be blown through the insulating layer 206. As a result, the fuse may be blown more easily. However, even in this case, the fuses 204 are partially buried in the interlayer insulating layer 200, so that the buried portions, especially, lower ends of sidewalls B2 in the interlayer insulating layer 200, may still lack reliability due to fuse residues.

SUMMARY OF THE INVENTION

The present invention is therefore directed to a fuse region of a semiconductor device and method of fabricating the same, which substantially overcome one or more of the problems due to the limitations and disadvantages of the related art.

It is a feature of an embodiment of the present invention to provide a fuse region of a semiconductor device that is capable of minimizing occurrence of a fuse residual during a repair process of the semiconductor device.

It is another feature of an embodiment of the present invention to provide a fuse region of a semiconductor device that is capable of preventing adjacent fuses from being damaged.

It is still another feature of an embodiment of the present invention to provide a method of fabricating such a fuse region of the semiconductor device.

At least one of the above and other features and advantages of the present invention may be realized by providing a fuse region of a semiconductor device including an interlayer insulating layer on a semiconductor substrate, a plurality of fuses on the interlayer insulating layer disposed in parallel with each other, a blocking layer on the interlayer insulating layer between each of the plurality of fuses and in parallel with the plurality of fuses, and a plurality of fuse grooves recessed into the interlayer insulating layer between each of the plurality of fuses and the blocking layer.

The blocking layer may include a first insulating layer pattern and a second insulating layer pattern, which are sequentially stacked on the interlayer insulating layer, the second insulating layer pattern having an etch rate lower than that of the first insulating layer pattern. The first insulating layer pattern may be a chemical vapor deposition (CVD) layer and the second insulating layer pattern may be a spin on glass (SOG) layer. The first insulating layer pattern may be one selected from the group consisting of a tetra-ethyl-ortho-silicate (TEOS) layer and a high-density plasma (HDP) oxide layer and the second insulating layer pattern may be a hydro silsesquioxane (HSQ) layer.

Each of the plurality of fuses may include a diffusion barrier layer pattern and a metal pattern, which are sequentially stacked on the interlayer insulating layer. The metal pattern may be aluminum (Al) or copper (Cu). The diffusion barrier layer pattern may be a stacked layer of a titanium (Ti) layer and a titanium nitride (TiN) layer.

At least one of the above and other features and advantages of the present invention may be realized by providing a method of fabricating a fuse region of a semiconductor device, including forming an interlayer insulating layer on a semiconductor substrate, forming a plurality of fuse patterns on the interlayer insulating layer to be parallel with each other, forming a first insulating layer conformably on the interlayer insulating layer having the plurality of fuse patterns, forming a second insulating layer on the first insulating layer to fill a space between each of the plurality of fuse patterns, the second insulating layer having an etch rate lower than that of the first insulating layer, and anisotropically etching a resultant structure having the second insulating layer using the plurality of fuse patterns as an etch mask to form a plurality of fuse grooves recessed into the interlayer insulating layer at a region adjacent to the each of plurality of fuse patterns and to form a blocking layer on the interlayer insulating layer between each of the plurality of fuse grooves.

Forming the fuse patterns may include sequentially forming a lower diffusion barrier layer, a metal layer and an upper diffusion barrier layer on the interlayer insulating layer, forming, on the upper diffusion barrier layer, a photoresist pattern having a line shape of parallel openings, anisotropically etching the upper diffusion barrier layer, the metal layer and the lower diffusion barrier layer using the photoresist pattern as an etch mask, and removing the photoresist pattern. Forming the metal layer may include using aluminum (Al) or copper (Cu). Forming the lower and upper diffusion barrier layer patterns may include stacking a titanium (Ti) layer and a titanium nitride (TiN) layer.

Forming the first insulating layer may include forming a chemical vapor deposition (CVD) layer and forming the second insulating layer comprises forming a spin-on-glass (SOG) layer. Forming the first insulating layer may include forming one selected from the group including a tetra-ethyl-ortho-silicate (TEOS) layer and a high-density plasma (HDP) oxide layer and forming the second insulating layer may include forming a hydro silsesquioxane (HSQ) layer.

Anisotropically etching the resultant structure having the second insulating layer may include forming a plurality of fuses, the plurality of fuse grooves, and the blocking layer, and etching a top of the plurality of fuse patterns. Forming each of the plurality of fuses may include forming a lower diffusion barrier layer pattern and a metal pattern, which are sequentially stacked.

Forming the blocking layer may include anisotropically etching the second insulating layer to form a second insulating layer pattern and a first insulating pattern between the fuse grooves, the first insulating layer pattern being under the second insulating layer pattern.

The method may further include forming a capping layer on the second insulating layer, after forming the second insulating layer. Forming the capping layer may include forming one selected from group consisting of a tetra-ethyl-ortho-silicate (TEOS) layer and a high-density plasma (HDP) oxide layer.

The method may further include forming a passivation layer conformably on an entire surface of the resultant structure after forming the plurality of fuse grooves and the blocking layer. Forming the passivation layer may include forming a silicon nitride layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
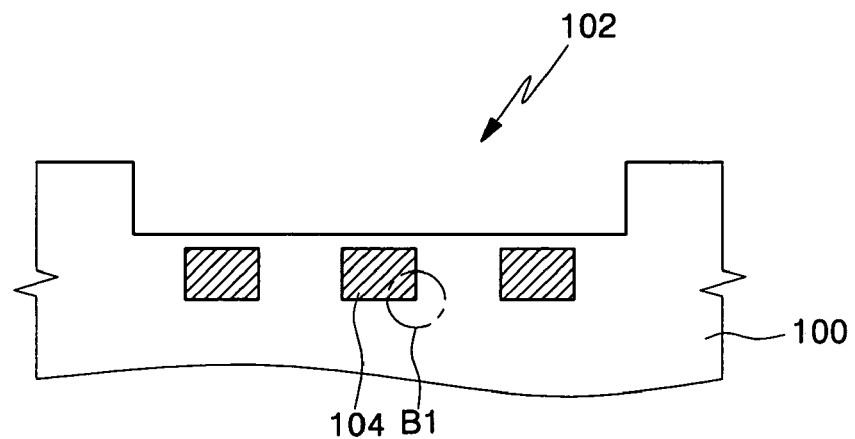
FIG. 1 illustrates a cross-sectional view of a fuse region of a conventional semiconductor device.
Figure 2:
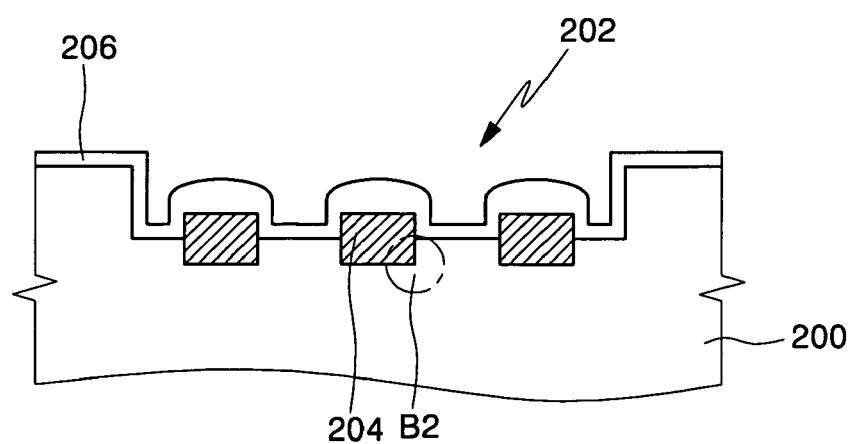
FIG. 2 illustrates a cross-sectional view of a fuse region of another conventional semiconductor device.

Korean Patent Application No. 2004-20520, filed on Mar. 25, 2004, in the Korean Intellectual Property Office, and entitled: "Fuse Region of a Semiconductor Device and Method of Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 3:
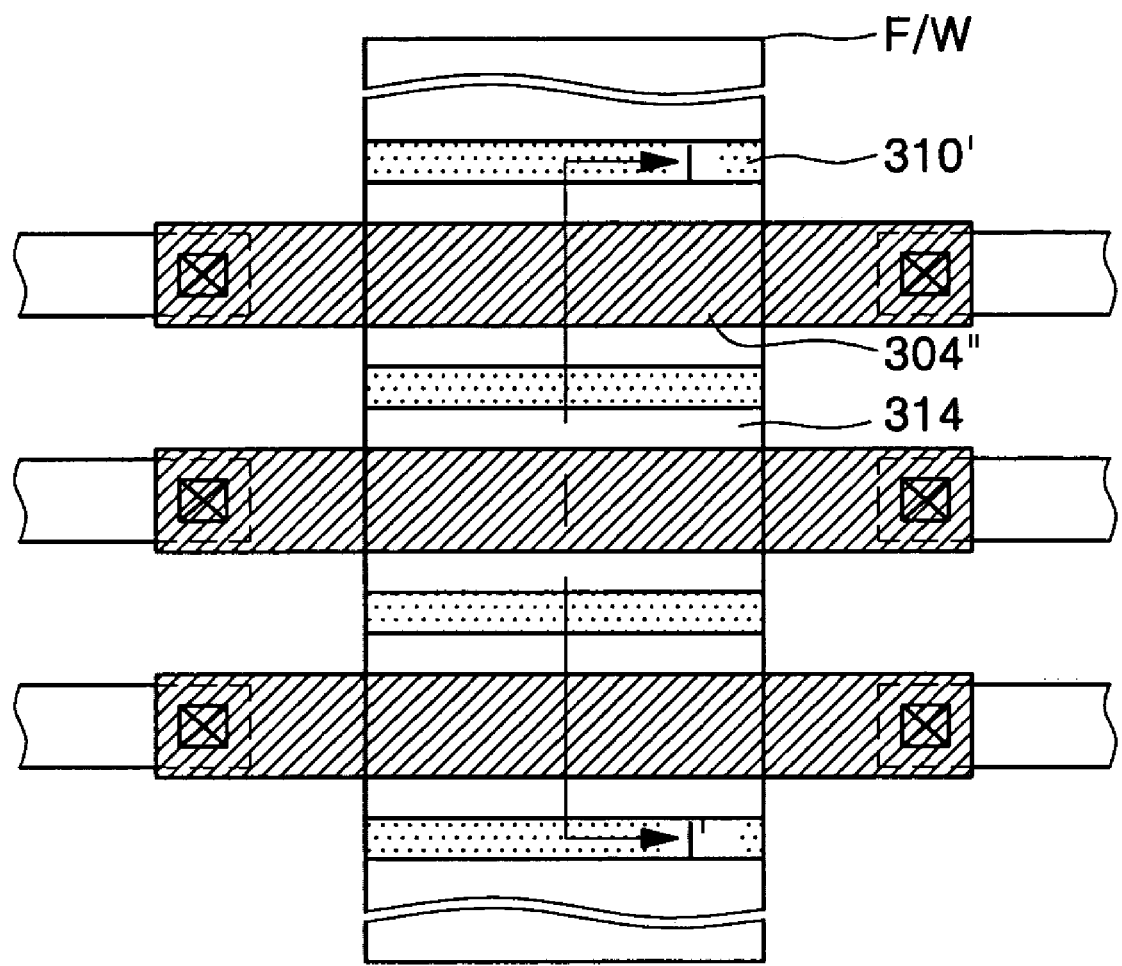
FIG. 3 illustrates a plan view of a fuse region of a semiconductor device according to an embodiment of the present invention.

FIG. 3 illustrates a plan view of a fuse region of a semiconductor device according to an embodiment of the present invention. FIGS. 4 through 9 illustrate cross-sectional views taken along line I-I' of FIG. 3 of stages in a method of fabricating a fuse region according to an embodiment of the present invention.

Initially, a fuse region according to an embodiment of the present invention will be described with reference to FIGS. 3 and 9.

Figure 9:
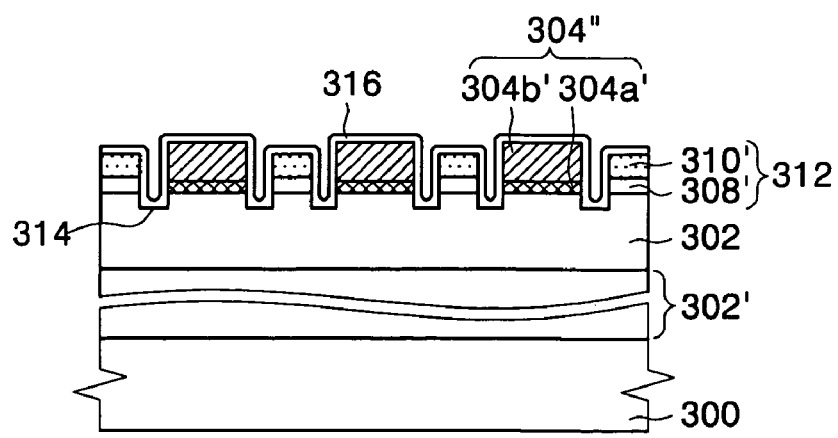

Referring to FIGS. 3 and 9, an interlayer insulating layer 302 is disposed on a semiconductor substrate 300. Although not shown, structures, e.g., transistors, may be disposed on the semiconductor substrate 300. At least one lower interlayer insulating layer 302' may be interposed between the semiconductor substrate 300 and the interlayer insulating layer 302. Fuses 304" are disposed on the interlayer insulating layer 302. The fuses 304" may preferably be disposed in parallel with each other, and each fuse 304" may be equidistant from an adjacent fuse 304". According to an embodiment of the present invention, each of the fuses 304" may include a lower diffusion barrier layer pattern 304a' and a metal pattern 304b' which are sequentially stacked. The metal pattern 304b' may preferably be formed of aluminum (Al) or copper (Cu). The lower diffusion barrier layer pattern 304a' may preferably be formed of a stacked layer of a titanium (Ti) layer and a titanium nitride (TiN) layer. Each of the fuses 304" may further include an upper diffusion barrier layer pattern (304c' of FIGS. 5 through 7) deposited on the metal pattern 304b'. If present, the upper diffusion barrier layer pattern may be formed of the same material as the lower diffusion barrier layer pattern 304a'.

Blocking layers 312 are disposed in parallel with the fuses 304" on the interlayer insulating layer 302 between each of the fuses 304". When a fuse is blown, the blocking layers 312 prevent adjacent fuses from being damaged by fuse fragments. The blocking layers 312 are formed of a first insulating layer pattern 308' and a second insulating layer pattern 310', which are sequentially stacked on the interlayer insulating layer 302. In the present invention, an etch rate, more specifically, a dry etch rate, of the second insulating layer pattern 310' is lower than that of the first insulating layer pattern 308'. The first insulating layer pattern 308' may be formed by a chemical vapor deposition (CVD) method, and the second insulating layer pattern 310' may be a spin-on-glass (SOG) layer. According to an exemplary embodiment of the present invention, when the first insulating layer pattern 308' is a tetra-ethyl-ortho-silicate (TEOS) layer or a silicon oxide layer formed by a high-density plasma (HDP) CVD method (hereinafter, referred to as a "HDP oxide layer"), the second insulating layer pattern 310' may be a hydro silsesquioxane (HSQ) layer.

As may be seen in FIGS. 3 and 9, recessed fuse grooves 314 are disposed in the interlayer insulating layer 302 between the blocking layers 312 and the fuses 304''. The fuses 304'' are exposed down to lower ends of their sidewalls by the fuse grooves 314. Therefore, occurrence of fuse residues is minimized during a repair process and a low-energy laser beam may be used to minimize damage to an adjacent fuse.

Furthermore, according to an embodiment of the present invention, a passivation layer 316 may be disposed to conformably cover the blocking layers 312, the fuse grooves 314 and the fuses 304''. The passivation layer 316 may be formed of a silicon nitride layer. However, when the metal pattern 304b' is a material, such as aluminum (Al) or copper (Cu), on which a natural oxide layer is formed only up to a certain depth from the surface when exposed to air, the natural oxide layer formed on the surface of the metal pattern 304b' may act as the passivation layer 316. Therefore, the passivation layer 316 may be omitted, as shown in FIG. 3.

A method of fabricating a fuse region of a semiconductor device according to an embodiment of the present invention will now be described with reference to FIGS. 4 through 9.

Figure 4:
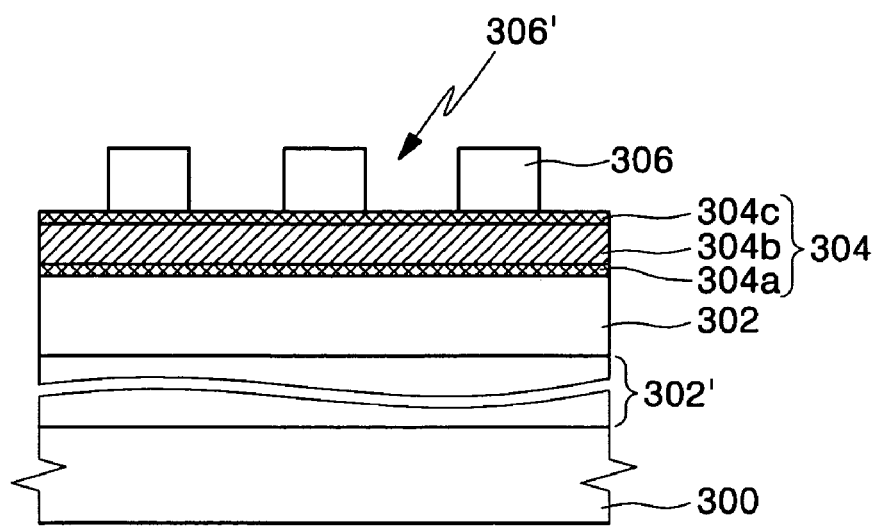
FIGS. 4 through 9 illustrate cross-sectional views taken along line I-I' of FIG. 3 of stages in a method of fabricating a fuse region according to an embodiment of the present invention.

Referring to FIGS. 3 and 4, the interlayer insulating layer 302 is formed on the semiconductor substrate 300. Prior to the formation of the interlayer insulating layer 302, at least one lower interlayer insulating layer 302' may be formed between the semiconductor substrate 300 and the interlayer insulating layer 302. The interlayer insulating layer 302 may preferably be formed of an insulating layer with a low-k dielectric constant, e.g., a borophosphosilicate glass (BPSG) layer, an undoped silicate glass (USG) layer or a fluorinated silicate glass (FSG) layer. A stack 304 including a lower diffusion barrier layer 304a, a metal layer 304b and an upper diffusion barrier layer 304c, which are sequentially formed on the interlayer insulating layer 302, is then formed. The metal layer 304b is formed of a metal wiring material of the semiconductor device. For example, the metal layer 304b may be formed of aluminum (Al) or copper (Cu). The lower and upper diffusion barrier layers 304a and 304c may be formed of a stacked layer of a titanium (Ti) layer and a titanium nitride (TiN) layer. A photoresist pattern 306 having a line shape of parallel opening 306' is then formed on the upper diffusion barrier layer 304c.

Figure 5:
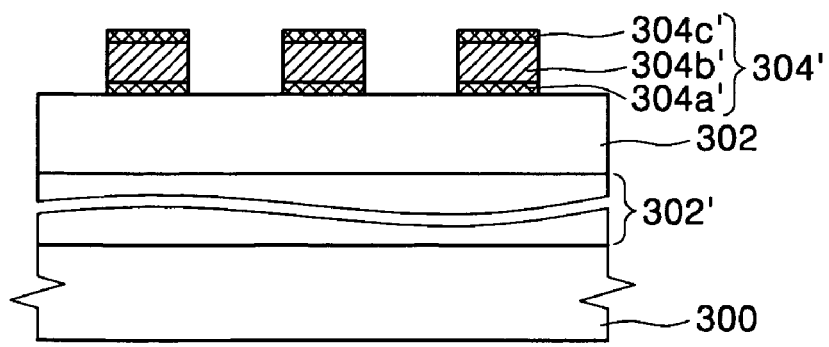

Referring to FIGS. 3 and 5, the upper diffusion barrier layer 304c, the metal layer 304b and the lower diffusion barrier layer 304a are anisotropically etched sequentially using the photoresist pattern 306 as an etch mask. Consequently, as shown in FIG. 5, fuse patterns 304' are formed to be parallel with each other on the interlayer insulating layer 302. The fuse patterns 304' include the lower diffusion barrier layer pattern 304a', the metal pattern 304b', and the upper diffusion barrier layer pattern 304c', which are sequentially stacked. Further, although not shown in the drawings, metal wirings constituting a circuit of the semiconductor device may be simultaneously formed with the fuse patterns 304' on the interlayer insulating layer 302 of, e.g., a pad region. After the fuse patterns 304' are formed, the photoresist pattern 306 is removed. The photoresist pattern 306 may be removed by a well-known ashing process.

Figure 6:
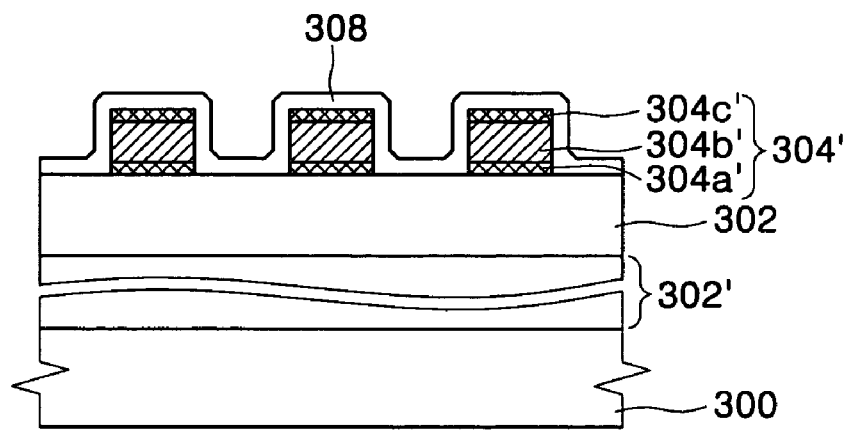

Referring to FIGS. 3 and 6, a first insulating layer 308 is conformably formed on the interlayer insulating layer 302 on which the fuse patterns 304' are formed. The first insulating layer 308 may be formed by a CVD method. According to an embodiment of the present invention, the first insulating layer 308 may preferably be formed of a TEOS layer or a HDP oxide layer. A width of each of the fuse grooves to be formed in the subsequent process is changed by a thickness of the first insulating layer 308 formed on sidewalls of the fuse patterns 304', as described below. Therefore, it is desirable that the first insulating layer 308 is formed in consideration of the width of the fuse groove.

Figure 7:
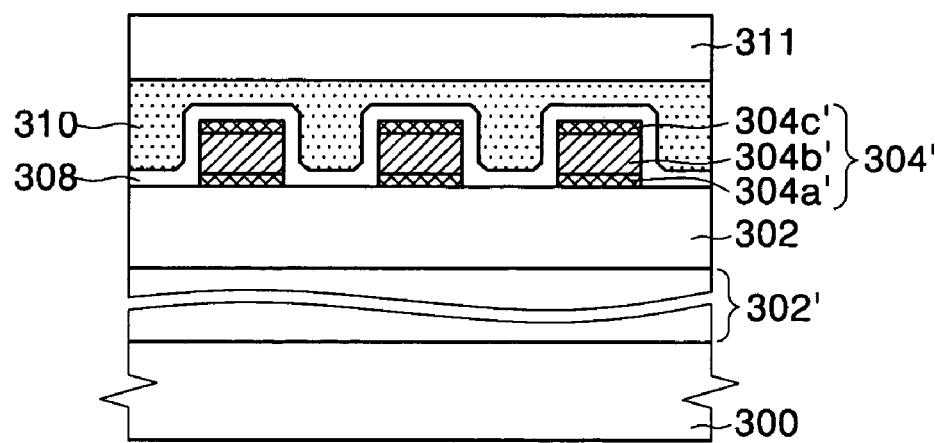

Referring to FIGS. 3 and 7, a second insulating layer 310 is formed on the first insulating layer 308. The second insulating layer 310 is formed to fill a space between the fuse patterns 304' and to cover the first insulating layer 308. According to an embodiment of the present invention, the second insulating layer 310 may preferably be formed of a SOG layer for surface planarization. Further, the second insulating layer 310 is formed of a layer having a dry etch rate lower than that of the first insulating layer. In the present embodiment, when the first insulating layer 308 is a TEOS layer or a HDP oxide layer, the second insulating layer 310 may preferably be formed of a HSQ layer. Furthermore, according to the present embodiment, a capping layer 311 may be formed on the second insulating layer 310. The capping layer 311 may be formed to protect metal wirings formed on the interlayer insulating layer 302 of other regions that are not shown in the drawings. The capping layer 311 may be formed of, e.g., a TEOS layer or a HDP oxide layer.

Figure 8:
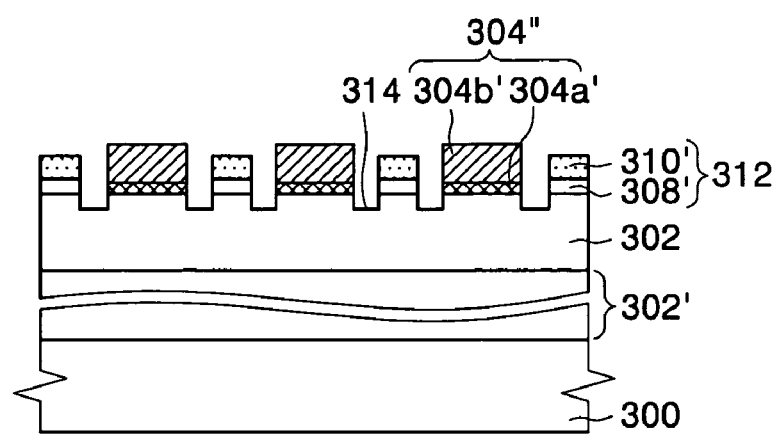

Referring to FIGS. 3 and 8, an anisotropic etching is performed on an entire surface of the resultant structure on which the capping layer 311, if present, and the second insulating layer 310 are formed. According to the present embodiment, several structures are simultaneously formed by the anisotropic etching process. More specifically, a fuse window (F/W of FIG. 3) is formed by the anisotropic etching process, and fuses 304'', blocking layers 312 and fuse grooves 314 are simultaneously formed in the F/W. The anisotropic etching process will now be described in detail.

Before performing the anisotropic etching process, a F/W photoresist pattern (not shown) having an opening in a region where the F/W is to be formed is provided on the resultant structure. The anisotropic etching is then performed using the F/W photoresist pattern and the fuse patterns 304' as an etch mask. At the beginning of the anisotropic etching process, the capping layer 311, if present, is first etched. Then, a top of the second insulating layer 310 is etched. Next, when the first insulating layer 308 is exposed to an etching environment, the first insulating layer 308 and the second insulating layer 310 are etched simultaneously. The anisotropic etching progresses until the fuse grooves 314 recessed into the interlayer insulating layer adjacent to the fuse patterns 304' are formed. As described above, according to the present invention, an etch rate of the second insulating layer 310 is lower than that of the first insulating layer 308. Therefore, the first insulating layer formed on the sidewalls of the fuse patterns 304' (hereinafter, referred to as a "spacer") is etched at a faster rate than the second insulating layer 310. While the spacer is totally etched, and the fuse grooves 314 having a width corresponding to the thickness of the spacer are formed in the interlayer insulating layer 302, some portion of the second insulating layer 310 in a region interposed between the spacers remains. As a result, the second insulating layer pattern 310', which is a remaining portion of the second insulating layer 310 on the interlayer insulating layer between the fuse grooves 314, and the first insulating layer pattern 308' under and protected by the second insulating layer pattern 310' are formed. The first insulating layer pattern 308' and the second insulating layer pattern 310' constitute the blocking layers 312 to prevent adjacent fuses from damage caused by fragments that may be generated when a fuse is blown. As described above, the width of the fuse grooves 314 corresponds to a thickness of the spacer. Therefore, according to the present embodiment, the width of the fuse grooves 314 and the width of the blocking layers 312 may be controlled by adjusting the thickness of the spacer, i.e., the thickness of the first insulating layer 308.

During this etching, a top of the fuse patterns 304', which act as an etch mask during the anisotropic etching process, may be recessed. More specifically, the upper diffusion barrier layer 304c' constituting the fuse patterns 304' may be removed and a thickness of the metal pattern 304b' may be reduced. As a result, the fuses 304" according to the present embodiment may have a different configuration from that of the fuse patterns 304'. In particular, the fuses 304" may include only the lower diffusion barrier layer pattern 304a' and the metal pattern 304b'. However, this may be changed depending on the anisotropic etching process. In some cases, the fuses 304" may include the lower diffusion barrier layer pattern 304a', the metal pattern 304b' and the upper diffusion barrier layer pattern 304c'.

Referring to FIGS. 3 and 9, the passivation layer 316 that conformably covers the blocking layers 312, the fuse grooves 314 and the fuses 304" may be additionally formed. The passivation layer 316 may be formed of a silicon nitride layer. However, when the metal pattern 304b' is a material such as aluminum (Al) or copper (Cu), on which a natural oxide layer is formed only up to a certain depth from the surface when exposed to air, the natural oxide layer formed on the surface of the metal pattern 304b' acts as the passivation layer 316. Therefore, in this case, the process of forming the passivation layer 316 may be omitted.

As described above, in the fuse region of the semiconductor device according to an embodiment of the present invention, fuse grooves are formed in the insulating layer in regions adjacent to the sidewalls of the fuses, so that the fuses are exposed on the insulating layer. Further, blocking layers are formed on an insulating layer between the fuses. Consequently, occurrence of fuse residues may be minimized and damage to adjacent fuses may be prevented during a repair process of the semiconductor device, thereby enhancing reliability of the repair process.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A fuse region of a semiconductor device, comprising:
    an interlayer insulating layer on a semiconductor substrate;
    a plurality of fuses on the interlayer insulating layer in parallel with each other;
    a blocking layer on the interlayer insulating layer between each of the plurality of fuses and in parallel with the plurality of fuses; and
    a plurality of insulating fuse grooves recessed into the interlayer insulating layer between each of the plurality of fuses and the blocking layer;
    wherein the blocking layer includes a first insulating layer pattern and a second insulating layer pattern, which are sequentially stacked on the interlayer insulating layer, the second insulating layer pattern having an etch rate lower than that of the first insulating layer pattern.

2. The fuse region as claimed in claim 1, wherein the first insulating layer pattern is a chemical vapor deposition (CVD) layer and the second insulating layer pattern is a spin on glass (SOG) layer.

3. The fuse region as claimed in claim 2, wherein the first insulating layer pattern is one selected from the group consisting of a tetra-ethyl-ortho-silicate (TEOS) layer and a high-density plasma (HDP) oxide layer and the second insulating layer pattern is a hydro silsesquioxane (HSQ) layer.

4. The fuse region as claimed in claim 1, wherein each of the plurality of fuses comprises a diffusion barrier layer pattern and a metal pattern, which are sequentially stacked on the interlayer insulating layer.

5. The fuse region as claimed in claim 4, wherein the metal pattern is aluminum (Al) or copper (Cu).

6. The fuse region as claimed in claim 4, wherein the diffusion barrier layer pattern is a stacked layer of a titanium (Ti) layer and a titanium nitride (TiN) layer.

7. The fuse region as claimed in claim 1, wherein an upper surface of the blocking layer is lower than an upper surface of the fuses.

8. A fuse region of a semiconductor device, comprising:
    an interlayer insulating layer on a semiconductor substrate;
    a plurality of fuses on the interlayer insulating layer in parallel with each other;
    a blocking layer on the interlayer insulating layer between each of the plurality of fuses and in parallel with the plurality of fuses; and
    a plurality of insulating fuse grooves recessed into the interlayer insulating layer between each of the plurality of fuses and the blocking layer;
    wherein the fuses are exposed down to lower ends of their sidewalls by the insulating fuse grooves.

9. A fuse region of a semiconductor device, comprising:
    an interlayer insulating layer on a semiconductor substrate;
    a plurality of fuses on the interlayer insulating layer in parallel with each other;
    a blocking layer on the interlayer insulating layer between each of the plurality of fuses and in parallel with the plurality of fuses; and
    a plurality of insulating fuse grooves recessed into the interlayer insulating layer between each of the plurality of fuses and the blocking layer;
    wherein the insulating fuse grooves are unfilled.

* * * * *